(12) United States Patent
Tsuji et al.

(10) Patent No.: US 6,606,926 B1
(45) Date of Patent: Aug. 19, 2003

(54) METHOD FOR PUNCHING BRITTLE MATERIAL AND PUNCHING DIE TO BE USED THEREFOR

(75) Inventors: Hiroyuki Tsuji, Nagoya (JP); Kazumasa Kitamura, Itinomiya (JP); Yoshinori Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/641,291

(22) Filed: Aug. 18, 2000

(30) Foreign Application Priority Data

Aug. 27, 1999 (JP) .......................................... 11-240974

(51) Int. Cl.⁷ ................................................. B26F 1/04
(52) U.S. Cl. .............................. 83/13; 83/687; 83/689; 83/622; 83/550
(58) Field of Search ........................... 83/13, 620, 687, 83/689, 691, 622, 688, 549, 550, 145, 146

(56) References Cited

U.S. PATENT DOCUMENTS

| | | | | | |
|---|---|---|---|---|---|
| 370,986 | A | * | 10/1887 | Stimpson, Jr. ............. | 83/687 X |
| 2,825,407 | A | * | 3/1958 | Widell ...................... | 83/687 |
| 3,608,413 | A | * | 9/1971 | Borello ..................... | 83/622 X |
| 4,611,520 | A | * | 9/1986 | Terracciano ................ | 83/549 |
| 4,898,056 | A | * | 2/1990 | Grobb et al. ............... | 83/689 |
| 5,303,618 | A | * | 4/1994 | Norell ..................... | 83/687 X |
| 5,517,888 | A | * | 5/1996 | Ray ........................ | 83/620 X |
| 5,697,273 | A | * | 12/1997 | Tsuzaki et al. ............. | 83/13 |
| 5,740,712 | A | * | 4/1998 | Watkins et al. ............. | 83/687 X |
| 6,047,623 | A | * | 4/2000 | Whiteman et al. ............ | 83/687 X |
| 6,079,924 | A | * | 6/2000 | Chiang ..................... | 83/620 X |
| 6,223,636 | B1 | * | 5/2001 | LaPlante et al. ............ | 83/13 |

FOREIGN PATENT DOCUMENTS

| EP | 0 781 634 A1 | 7/1997 |
|---|---|---|
| JP | 03142198 | 6/1991 |
| JP | 06031696 | 2/1994 |

\* cited by examiner

*Primary Examiner*—Charles Goodman
(74) *Attorney, Agent, or Firm*—Burr & Brown

(57) ABSTRACT

A method of forming a plurality of holes of fine diameter d in a brittle material at fine intervals α includes the steps of forming at least two holes having a fine diameter d at intervals A in the brittle material through the use of punches. The intervals A are at least two times the fine interval α. Holes are then subsequently punched between the previously punched holes at intervals A without removing the die punches used to form the previous holes. The distances between the previously punched holes and the subsequently punched holes measure at least the distance corresponding to the fine interval α.

6 Claims, 3 Drawing Sheets

FIG.3
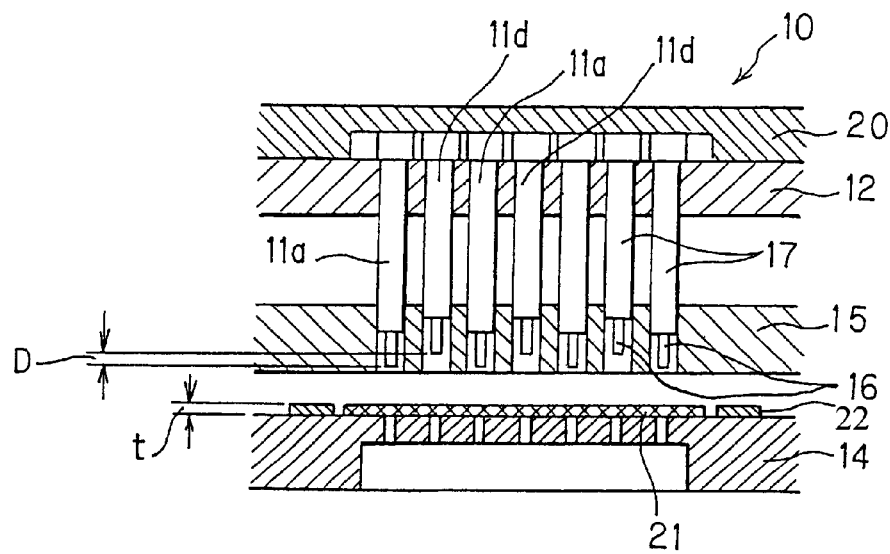
FIG.4 - PRIOR ART
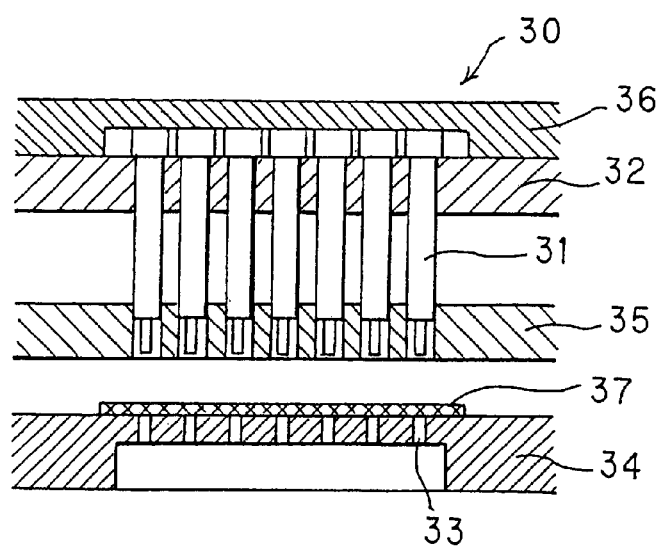

METHOD FOR PUNCHING BRITTLE MATERIAL AND PUNCHING DIE TO BE USED THEREFOR

BACKGROUND OF THE INVENTION

1. Field of the Invention

The present invention relates to a method for punching a plurality of holes at fine pitches on brittle material such as compound sheets formed by particles and high polymers, ceramic green sheets, glass epoxy substrates, or functional particles dispersed organic films without causing any cracks, and a die to be used therefor.

2. Description of Related Art

Conventionally, brittle materials such as compound sheets formed by particles and high polymers, ceramic green sheets, glass epoxy substrates or functional particles dispersed in organic films are often used for fabricating circuit substrates, oscillating plates, or resilient plates.

For such brittle materials, a plurality of fine holes is formed at fine pitches according to the required configuration of target final products.

FIG. 4 is a cross-sectional view showing an example of the conventional punching die, wherein a die 30 comprises a plurality of punches 31, a punch plate 32, a die 34 having a plurality of fine holes 33, and a stripper 35. The reference numeral 36 denotes a cover portion and the numeral 37 denotes a brittle material such as ceramic green sheets.

However, since the demand for denser circuit boards of recent years requires lessening of the pitch of a plurality of fine holes, there is an increasing tendency to generate cracks between punched holes when the conventional die shown in FIG. 4 is used. In the case of ceramic green sheets, depending on the thickness or quality thereof, cracks occur with growing frequency during formation of a plurality of fine holes with pitches of 500 $\mu$m or less.

SUMMARY OF THE INVENTION

Accordingly, it is an object of the present invention to provide a method for forming a plurality of holes of fine diameters at fine pitches on a brittle material without generating any cracks thereon.

After an elaborate study and investigation to avoid occurrence of cracks during formation of fine holes, the inventor found that the problem described above may be overcome by punching the plurality of fine holes with a time shift, rather than all at one time, and thus attained the present invention.

According to the invention, the method for punching a plurality of holes having fine diameters d at fine intervals $\alpha$ on a brittle material comprising the steps of forming at least two holes including a hole of fine diameter d at intervals A, each of which is at least two times the fine interval $\alpha$, by the use of a punching die, and punching holes between the previously punched holes at intervals A so that the distance from the punched holes of diameter d measures at least the distance corresponding to the fine interval $\alpha$, without removing the punches used to form the holes in the previous step.

Brittle material in the present invention includes compound sheets formed by particles and high polymers, ceramic green sheets, glass epoxy substrates, or functional particles dispersed organic films. The most preferable material is a ceramic green sheet.

The fine intervals $\alpha$ are preferably in the range between 30 and 500 $\mu$m, and more preferably between 30 and 300 $\mu$m. The fine diameter d for the hole is preferably in the range between 20 and 480 $\mu$m, and more preferably between 50 and 200 $\mu$m.

According to the present invention, the punching die comprising a plurality of punches having punching tips, a punch plate for holding the punch, a die having a plurality of fine holes of a prescribed diameter through which the punching tips are inserted and removed, and a stripper for grasping the tips of the punches and for peeling the punched brittle material off the punch when removing the punch from the die, wherein a plurality of punches consists of two groups of punches, so that the position of the apexes of the punching tips of one group differs from that of the other group.

While the die punch used in the invention is preferably formed in such a manner that the shortest apex-to-apex distance D out of the apex-to-apex distances between at least two groups is larger than the thickness of brittle material t, it is also possible to form so that the relation between the apex-to-apex distance D and the thickness brittle material t satisfies the relation; $(2/3) \times t < D$.

BRIEF DESCRIPTION OF THE DRAWINGS

FIG. 3 is a cross sectional view showing still another example of the punching die according to the present invention;

FIG. 4 is a cross sectional view showing an example of the conventional punching die.

DETAILED DESCRIPTION OF THE INVENTION

The invention is now described in detail.

Figure 5:
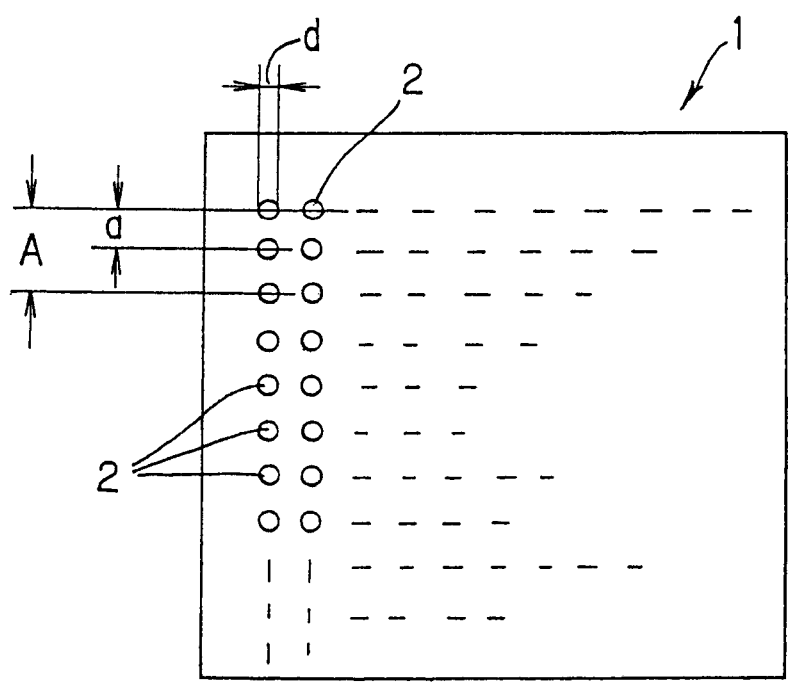
FIG. 5 is an explanatory drawing illustrating the relation among the fine interval $\alpha$, the fine diameter d, and the interval A for brittle material.

According to the invention, as shown in FIG. 5, when a plurality of holes 2 of fine diameter d are punched on brittle material 1 such as a ceramic green sheet at fine intervals (pitches) $\alpha$, the punching operation is initiated by the step of punching a plurality of holes including a hole 2 of fine diameter d at intervals A, each of which is at least two times the fine interval $\alpha$ (two times of $\alpha$ in FIG. 5), by the use of a die punch.

Then holes are punched between the previously punched holes at intervals A so that distances from the punched holes of fine diameter d measure at least the distance corresponding to the interval $\alpha$ before the die punch that has already started punching completes its punching operation or before such a die punch is removed.

Since, in the punching method of the present invention, a plurality of holes are formed first at prescribed intervals A, and then a plurality of holes are formed between the previously punched holes at intervals A so that the distances from the punched holes measure the distance corresponding to the fine interval $\alpha$ before removing the die punch, cracks that tend to occur when all the holes with fine intervals $\alpha$ are punched at the same time can be prevented.

Though ceramic green sheets are preferably used as brittle material to be punched according to the invention, compound sheets formed by particles and high polymer, glass epoxy substrates, or organic films dispersed with functional particles are also applicable.

Though the fine intervals α described above may vary depending on the type of brittle material, in case where ceramic green sheets are used, the intervals α are preferably in the range between 30 and 500 µm, and more preferably between 30 and 300 µm. The fine diameter d of the holes may vary depending on the type of brittle material as well, in the case where ceramic green sheets are used, the fine diameter d is preferably in the range between 20 and 480 µm, and more preferably in the range between 30 and 200 µm. The fine diameters d for the plurality of holes does not have to be necessarily identical.

The die to be used for the punching method of the invention will now be described in detail according to attached figures.

Figure 1:
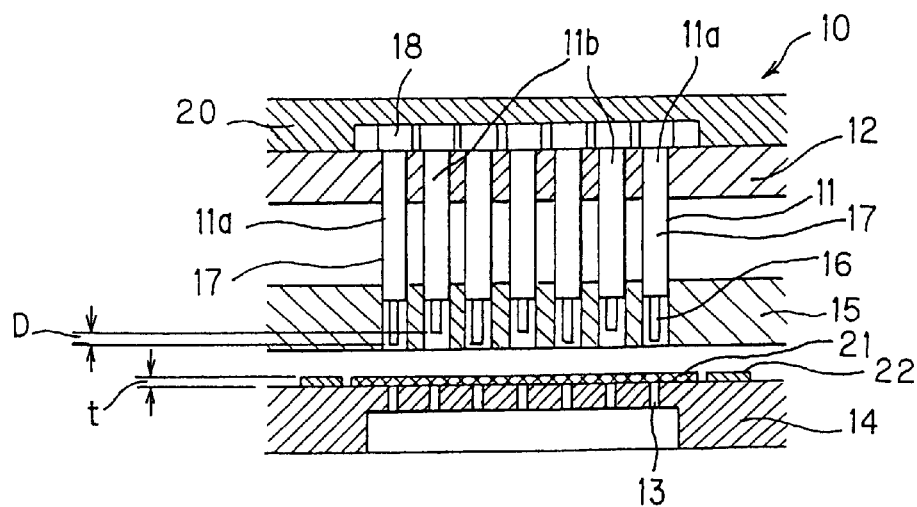
FIG. 1 is a cross sectional view showing an example of the punching die according to the present invention.

FIG. 1 is a cross-sectional view showing an example of the punching die according to the invention. The die 10 comprises a plurality of punches 11, a punch plate 12, a die 14 including a plurality of fine holes 13, and a stripper 15.

The plurality of punches 11 respectively comprise a punching tip portion 16, a columnar portion 17 and a base portion 18. The columnar portions 17 of the punches are respectively inserted into a plurality of holes formed on the punch plate 12, and a cover portion 20 is placed on the base portions 18 so that the cover portion 20 prevents the base portions 18 that are larger than the columnar portions 17 in diameter from being removed.

The die 14 comprises a plurality of fine holes 13 of prescribed diameter for insertion and extraction (insertion and removal) of the punching tips 16 of the punches 11, and brittle material to be punched 21 is placed on the die 14.

The stripper disposed between the punch plate 12 and the die 14 serves to position the punches 11 by gripping the punching tips 16 of the punches 11 and to peel brittle material 21 off the punches 11 so that brittle material 21 to be punched is prevented from being adhered to punches 11 and from being moved together with the punches 11.

The reference numeral 22 denotes a stopper disposed on the die 14 on the peripheral side of brittle material 21 to prevent brittle material 21 from being crushed by the stripper 15. Without stopper 22, the stripper 15 may crush brittle material 21, thereby deforming brittle material 21 and thus resulting in the reduced positional accuracy of the holes after being punched.

In the die 10 of the invention, as shown in FIG. 1, a plurality of punches 11 consists of two groups of punches that are different in the position of the apexes of the punching tips 16 from each other.

By constituting a plurality of punches 11 of two groups that are different in the portion of the apexes of the punching tips 16 from each other as described above, when a plurality of fine holes are punched on brittle material 21, those fine holes are punched with a time shift, but not all at once.

In the first embodiment, two groups of punches; one group 11a having the apexes of the punching tips 16 at the higher position and the other group 11b having the apexes of punching tips 16 at the lower position are shown. In FIG. 1, the height of the apexes is differentiated not by changing the length of the columnar portion 17, but by changing the length of the punching tips 16.

In this case, the apex-to-apex distance D between the apexes of punches belonging to the group 11a and the apexes of punches belonging to the group 11b is preferably larger than the thickness t of brittle material, but the relation satisfying $(2/3) \times t < D$ is also acceptable.

Figure 2:
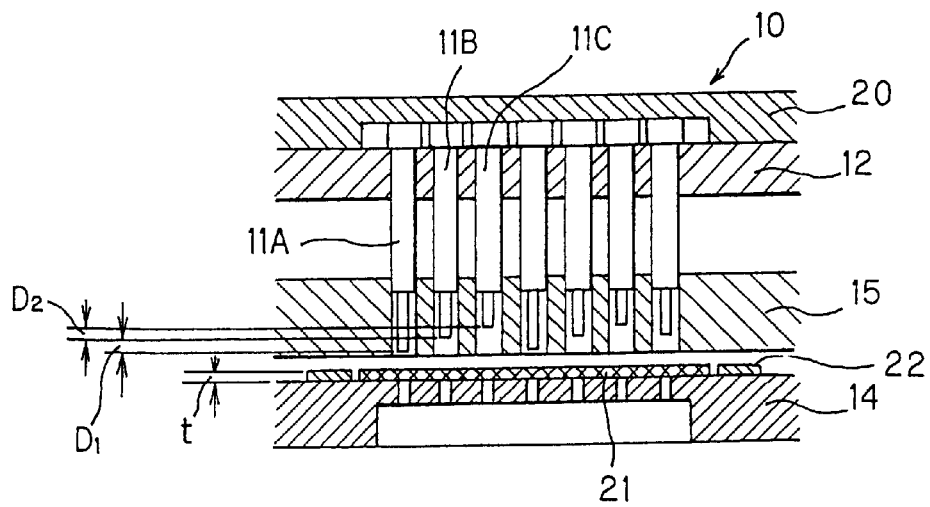
FIG. 2 is a cross sectional view showing another example of the punching die according to the present invention.

FIG. 2 is a cross sectional view showing another example of the punching die according to the invention, showing three groups of punches; a group of punches 11A of which the apexes of the punching tips 16 are in the highest position, a group of punches 11B of which the apexes of the punching tips 16 are in the middle position, and a group of punches 11C of which the apexes of the punching tips 16 are in the lowest position.

In such a case, it is preferable that the apex-to-apex distance $D_1$ between the apexes of the punches that belong to the group 11A and those belong to the group 11B, and the apex-to-apex distance $D_2$ between the apexes of the punches that belong to the group 11B and those belong to the group 11C are respectively larger than the thickness t of brittle material, but the relation satisfying $(2/3) \times t < D_1$ (and $D_2$) is also acceptable.

Though the three groups of punches in the embodiment shown in FIG. 2 are arranged in the order of decreasing height of the apex, that is, of group 11A, group 11B, and group 11C consecutively from the left to right, they may be arranged in the order of, for example, group 11A, group 11C, and group 11B from the left to right.

FIG. 3 is a cross sectional view showing still another example of the punching die according to the invention, in which the height of the apexes are differentiated by changing the length of the columnar portions 17, not by changing the length of the punching tips 16.

Embodiments

A ceramic green sheet of 0.2 mm in thickness as brittle material was punched by the use of the punching die shown in FIG. 1. When punching operation was carried out under the conditions where the interval A is 400 µm, the fine interval (pitch) α is 200 µm, and the fine diameter d is 150 µm, for both cases where the apex-to-apex distance D, that is, the distance between the apexes of the punches belonging to the group 11a and the apexes of the punches belonging to the group 11b is 250 µm, and where it is 150 µm, occurrence of cracks could be prevented.

Though the invention has been described so far according to the embodiments shown in the figures, it is obvious that the invention is not limited to these embodiments.

As is described thus far, according to the punching method and the die of the invention, when a plurality of fine holes are punched at fine pitches, occurrence of cracks can be prevented by punching a plurality of fine holes with a time shift, rather than by punching all the holes at the same time.

What is claimed is:

1. A method for forming a plurality of holes of fine diameter d at fine intervals α in a ceramic green sheet by punching, comprising the steps of:

providing a die punch having a main surface and a plurality of punches adapted to extend therefrom;

providing a die having a plurality of holes corresponding to said plurality of punches;

providing a stripper between said die punch and said die;

providing a stopper on said die to prevent said stripper from crushing the ceramic green sheet;

punching at least two holes having said fine diameter d at intervals A in the ceramic green sheet through the use of the punches, said intervals A being at least two times the fine interval α; and subsequently punching holes having said fine diameter d between the previously punched holes at said intervals A without removing the die punches used to form said at least two holes, such that distances between the previously punched holes and the subsequently punched holes measure at least the distance corresponding to the interval α.

2. A method as set forth in claim 1, wherein said die punch comprises at least two groups of punches in which positions of apexes of respective tip portions differ from one another, and wherein a shortest apex-to-apex distance D out of the apex-to-apex distances of the respective groups of punches is larger than a thickness t of the ceramic green sheet.

3. A method as set forth in claim 1, wherein said die punch comprises at least two groups of punches in which positions of apexes of respective tip portions differ from one another, and a relation between a shortest apex-to-apex distance D out of the apex-to-apex distances of the respective groups of punches and a thickness t of the ceramic green sheet satisfies:

$$(2/3) \times t < D.$$

4. A method of as set forth in claim 1, wherein α is in a range of between 30 μm and 500 μm.

5. A method as set forth in claim 1, wherein d is in a range between 20 μm and 480 μm.

6. A method as set forth in claim 1, wherein said die punch comprises at least two groups of punches in which an apex-to-apex distance between at least two punches in one group differs from an apex-to-apex distance between at least two punches in another group.

* * * * *